United States Patent
Chen et al.

(10) Patent No.: US 9,823,713 B2
(45) Date of Patent: Nov. 21, 2017

(54) SYSTEMS AND METHODS FOR MOUNTING AND DISMOUNTING COMPUTING COMPONENTS

(71) Applicant: Quanta Computer Inc., Taoyuan (TW)

(72) Inventors: Chao-Jung Chen, Taoyuan (TW); Pin-Chang Wang, Taoyuan (TW); Shih-Wei Chao, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 138 days.

(21) Appl. No.: 14/723,970

(22) Filed: May 28, 2015

(65) Prior Publication Data

US 2016/0183401 A1    Jun. 23, 2016

Related U.S. Application Data

(60) Provisional application No. 62/093,664, filed on Dec. 18, 2014.

(51) Int. Cl.
| | |
|---|---|
| *G06F 1/16* | (2006.01) |
| *G06F 1/18* | (2006.01) |
| *H05K 7/14* | (2006.01) |
| *G11B 33/12* | (2006.01) |

(52) U.S. Cl.
CPC ............ *G06F 1/187* (2013.01); *G11B 33/124* (2013.01); *H05K 7/1487* (2013.01); *G06F 1/16* (2013.01)

(58) Field of Classification Search
CPC ...... G06F 1/187; H05K 7/1487; G11B 33/124
USPC ........................ 361/679.33, 679.37
See application file for complete search history.

(56) References Cited

U.S. PATENT DOCUMENTS

| | | | | |
|---|---|---|---|---|
| 5,224,019 A | * | 6/1993 | Wong | G06F 1/184 361/679.32 |
| 5,741,055 A | * | 4/1998 | Chen | G06F 1/184 312/348.6 |
| 6,606,241 B2 | * | 8/2003 | Moore | G06F 1/1616 292/19 |
| 6,751,093 B1 | * | 6/2004 | Hsu | G06F 1/184 361/679.33 |
| 7,775,816 B1 | * | 8/2010 | Huang | G11B 33/124 439/159 |
| 9,203,187 B2 | * | 12/2015 | Kuo | H01R 13/62977 |

(Continued)

FOREIGN PATENT DOCUMENTS

| | | |
|---|---|---|
| TW | 560674 U | 11/2003 |
| TW | M372059 U1 | 1/2010 |

OTHER PUBLICATIONS

Office Action in Taiwanese Application No. 104126139, dated Sep. 23, 2016 (w/ English First Action Summary).

*Primary Examiner* — Nidhi Thaker

(74) *Attorney, Agent, or Firm* — Nixon Peabody LLP; Eduardo J. Quinones; Zhou Lu

(57) ABSTRACT

Various embodiments of the present technology provide systems and methods for mounting and dismounting a computing component (e.g., a HDD) of a server system. The server system contains a motherboard that includes at least one designated base bracket. Each of the at least one designated base bracket is configured to enable a carrier of a computing component to be mounted on and detached from. A designated base bracket can include one or more movable pins, one or more fixed pins, and a close latch.

19 Claims, 11 Drawing Sheets

(56) References Cited

U.S. PATENT DOCUMENTS

| | | | |
|---|---|---|---|
| 2005/0038926 A1* | 2/2005 | Chang | G06F 1/184 710/8 |
| 2007/0019379 A1* | 1/2007 | Hsiao | G06F 1/187 361/679.02 |
| 2010/0031279 A1* | 2/2010 | Hsieh | G06F 1/1616 720/613 |
| 2010/0208423 A1* | 8/2010 | Lai | G11B 33/124 361/679.38 |

* cited by examiner

SYSTEMS AND METHODS FOR MOUNTING AND DISMOUNTING COMPUTING COMPONENTS

RELATED APPLICATIONS

This application claims priority to U.S. provisional application 62/093,664, filed Dec. 18, 2014, and entitled "Bare HDD Release Mechanism", the disclosure of which is hereby incorporated herein by reference in its entirety for all purposes.

TECHNICAL FIELD

The present technology relates generally to systems and methods for mounting and dismounting computing components.

BACKGROUND

Modern server farms or datacenters typically employ a large number of servers to handle processing needs for a variety of application services. Each server employs a large number of computing components (e.g., hard disk drives HDDs). Components of a server may need to be repaired or replaced by a technician or user.

However, a traditional component (e.g., HDD) of a server system is permanently mounted on a motherboard of the server system. Replacing such traditional components may take up substantial server downtime. Thus, there is a need to provide a system and method for mounting and dismounting a component of a server system such that the component can be easily and quickly replaced.

SUMMARY

Systems and methods in accordance with various embodiments of the present technology provide a solution to the above-mentioned problems by providing a mechanism for mounting and dismounting a computing component (e.g., a HDD) of a server system. More specifically, various embodiments of the present technology provide a carrier for a computing component of a server system such that the computing component can be easily mounted and dismounted from the server system. In some implementations, the server system includes a motherboard that can contain a designated base bracket for the computing component. The designated base bracket can be configured to allow the carrier to be quickly and easily installed and detached. The base bracket can include one or more movable pins, one or more fixed pins, and a close latch. In response to the carrier being slid from an open position to a close position on the designated base bracket, the one or more movable pins can be caused to secure the carrier to the designated base bracket. In response to the carrier being released from the close position on the designated base bracket, the one or more movable pins can be caused to unsecure the carrier from the designated base bracket.

In some embodiments, each movable pin of a designated base bracket for a computing component includes one or more linkage parts and one or more contacting parts touching at least one portion of a carrier of the computing component when the carrier is placed on top of the designated base bracket. The sliding of the carrier on the designated base bracket can cause the one or more contacting parts to move in the same direction of the carrier and further cause the one or more corresponding linkage parts to either tighten at least one movable pin against the carrier or detach the at least one movable pin from the carrier depending on a sliding direction of the carrier relative to the designated base bracket.

In some embodiments, in response to a carrier of a computing component being slid into a close position on a corresponding base bracket, a close latch of the corresponding base bracket can further secure the carrier inside the base bracket. In some implementation, the close latch is a button latch. The button latch is activated when the carrier slides into the close position. The button latch has to be deactivated before the computing component can be slid out of a close position or dismounted.

In some embodiments, a close latch of a base bracket can be deactivated by an action associated with a release latch of a corresponding base bracket. For example, the close latch can be deactivated when a user or technician pushes the release latch. In response to the release latch being pushed, the close latch can be deactivated. A bracket attached to the base bracket can then be slid out of a close position and further removed from the base bracket.

In some embodiments, a carrier of a computing component can be configured to disengage a close latch of a corresponding base bracket when the carrier is not in a close position. For example, a portion of a carrier can be configured to press a button latch of a corresponding base bracket when the carrier is in a non-close position, and causes the button latch to be disengaged until the carrier is slid into a close position.

In some embodiments, a computing component of a server system can be quickly mounted onto and detached from a corresponding carrier through an interaction between at least one fixed pin and at least one corresponding hole. In some implementations, the at least one fixed pin includes one or more side pins located at one side of the computing component while the at least one corresponding hole is located on the carrier. In some implementations, the at least one fixed pin is located on the carrier while the at least corresponding hole is located at one side of the computing component.

BRIEF DESCRIPTION OF THE DRAWINGS

In order to describe the manner in which the above-recited and other advantages and features of the disclosure can be obtained, a more particular description of the principles briefly described above will be rendered by reference to specific examples thereof which are illustrated in the appended drawings. Understanding that these drawings depict only example aspects of the disclosure and are not therefore to be considered to be limiting of its scope, the principles herein are described and explained with additional specificity and detail through the use of the accompanying drawings in which.

DETAILED DESCRIPTION

Various embodiments of the present technology provide systems and methods for mounting and dismounting a computing component (e.g., a HDD) of a server system. The server system contains a motherboard that includes at least one designated base bracket. Each of the at least one designated base bracket is configured to enable a carrier of a computing component to be mounted on and detached from. A designated base bracket can include one or more movable pins, one or more fixed pins, and a close latch.

Figure 1A:
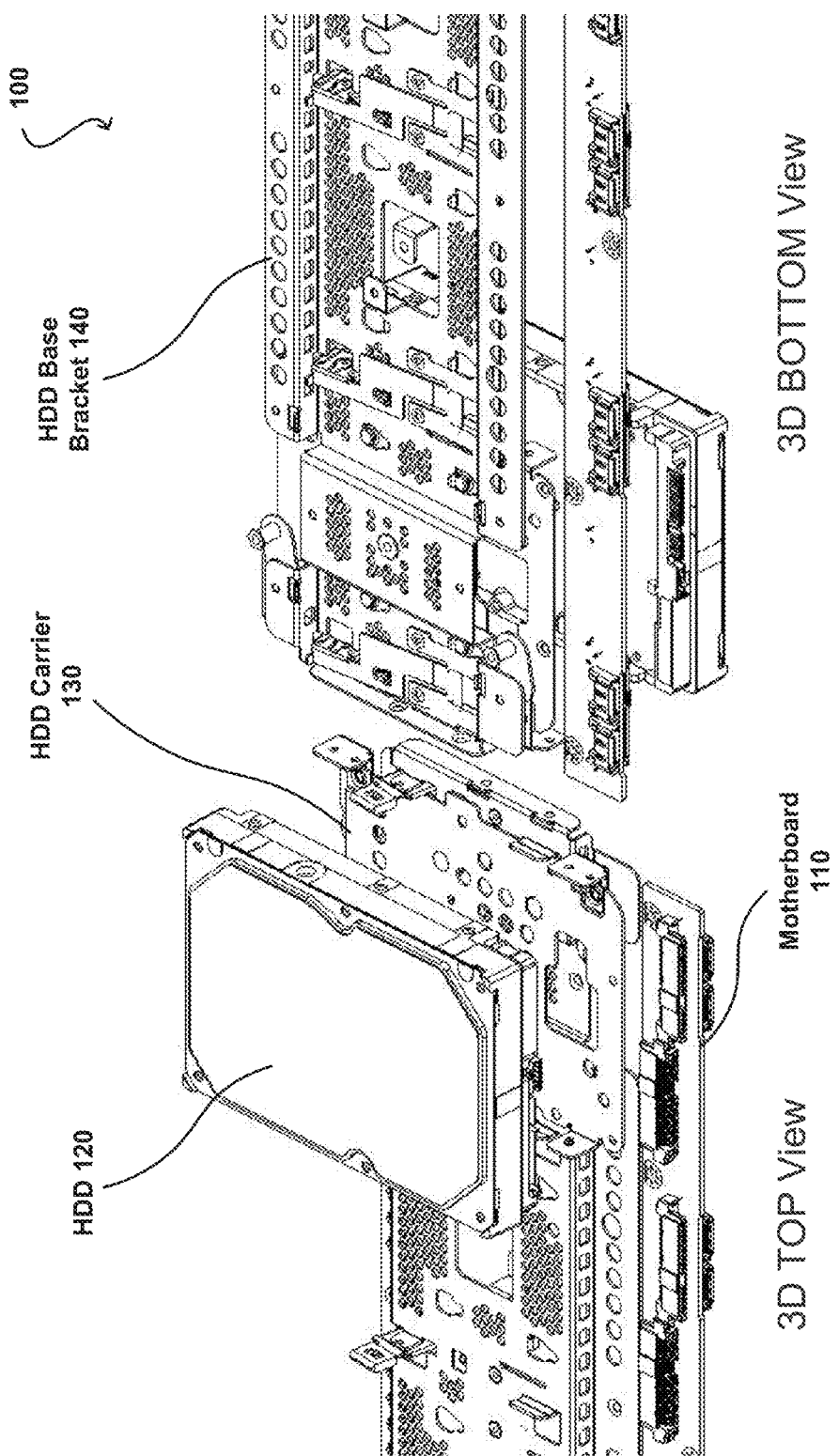
FIG. 1A illustrates a schematic block diagrams of an exemplary server system containing at least one HDD carrier and at least one corresponding base bracket attached to a motherboard of the server system in accordance with an implementation of the present technology.

FIG. 1A illustrates a schematic block diagrams of an exemplary server system 100 containing at least one HDD carrier 130 and at least one corresponding HDD base bracket 140 attached to a motherboard 110 of the server system 100 in accordance with an implementation of the present technology. In this example, the server system 100 comprises a HDD 120, the HDD carrier 130, the HDD base bracket 140, and the motherboard 110. In some implementations, the motherboard 110 can also contain at least one central processing unit (CPU), at least one memory, one or more connectors, a sound card, a video card, a network card, and various other components.

In some implementations, the server system 100 includes one or more PSUs (not shown) that converts an AC power supply to the server system 100 and provides power to various component (not shown) of the server system 100, such as at least one microprocessor or CPU, cache, NB logic, PCIe slots, Memory, SB logic, ISA slots, PCI slots, UPS and/or a controller. After being powered on, the server system 100 is configured to load software application from memory, computer storage device, or an external storage device to perform various operations.

In some implementations, the main memory of the server system 100 can be coupled to the CPU via a north bridge (NB) logic. A memory control module can be used to control operations of the memory by asserting necessary control signals during memory operations. The main memory may include, but is not limited to, dynamic random access memory (DRAM), double data rate DRAM (DDR DRAM), static RAM (SRAM), or other types of suitable memory.

In some implementations, the CPU can be multi-core processors, each of which is coupled together through a CPU bus connected to the NB logic. In some implementations, the NB logic can be integrated into the CPU. The NB logic can also be connected to a plurality of peripheral component interconnect express (PCIe) ports and a south bridge (SB) logic (optional). The plurality of PCIe ports can be used for connections and buses such as PCI Express x1, USB 2.0, SMBus, SIM card, future extension for another PCIe lane, 1.5 V and 3.3 V power, and wires to diagnostics LEDs on the server's chassis.

In some implementations, the NB logic and the SB logic of the server system 100 are connected by a peripheral component interconnect (PCI) Bus. The PCI Bus can support function on the CPU in a standardized format that is independent of any of CPU's native buses. The PCI Bus can be further connected to a plurality of PCI slots (e.g., a PCI slot). Devices connect to the PCI Bus may appear to a bus controller as being connected directly to a CPU bus, assigned addresses in the CPU's address space, and synchronized to a single bus clock. PCI cards can be used in the plurality of PCI slots include, but are not limited to, network interface cards (NICs), sound cards, modems, TV tuner cards, disk controllers, video cards, small computer system interface (SCSI) adapters, and personal computer memory card international association (PCMCIA) cards.

In some optional implementations, the SB logic can couple the PCI bus to a plurality of expansion cards or slots (e.g., an ISA slot) via an expansion bus. The expansion bus can be a bus used for communications between the SB logic and peripheral devices, and may include, but is not limited to, an industry standard architecture (ISA) bus, PC/104 bus, low pin count bus, extended ISA (EISA) bus, universal serial bus (USB), integrated drive electronics (IDE) bus, or any other suitable bus that can be used for data communications for peripheral devices.

In some implementations, the NB logic is further coupled to a controller that is connected to the at least one PSU. In some implementations, the controller can be a baseboard management controller (BMC), rack management controller (RMC), a keyboard controller, or any other suitable type of system controller. The controller is configured to control operations of the one or more PSUs and/or other applicable operations. In some implementations, the controller is configured to monitor processing demands, power consumptions, and components and/or connection status of the server system 100.

Figure 1B:
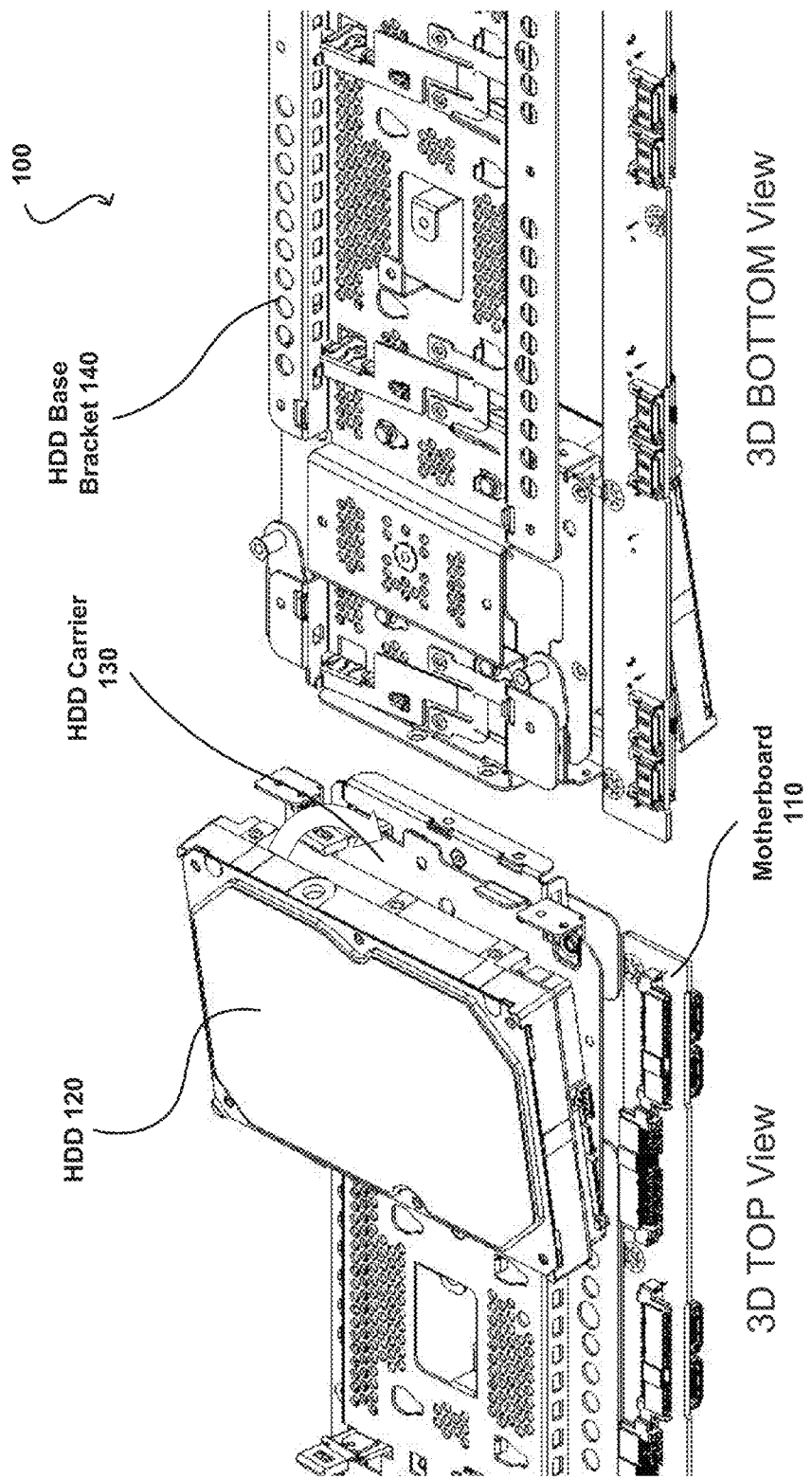
FIGS. 1B and 1C demonstrate schematic block diagrams of an exemplary HDD carrier and an exemplary HDD base bracket in accordance with implementations of the present technology.
Figure 1C:
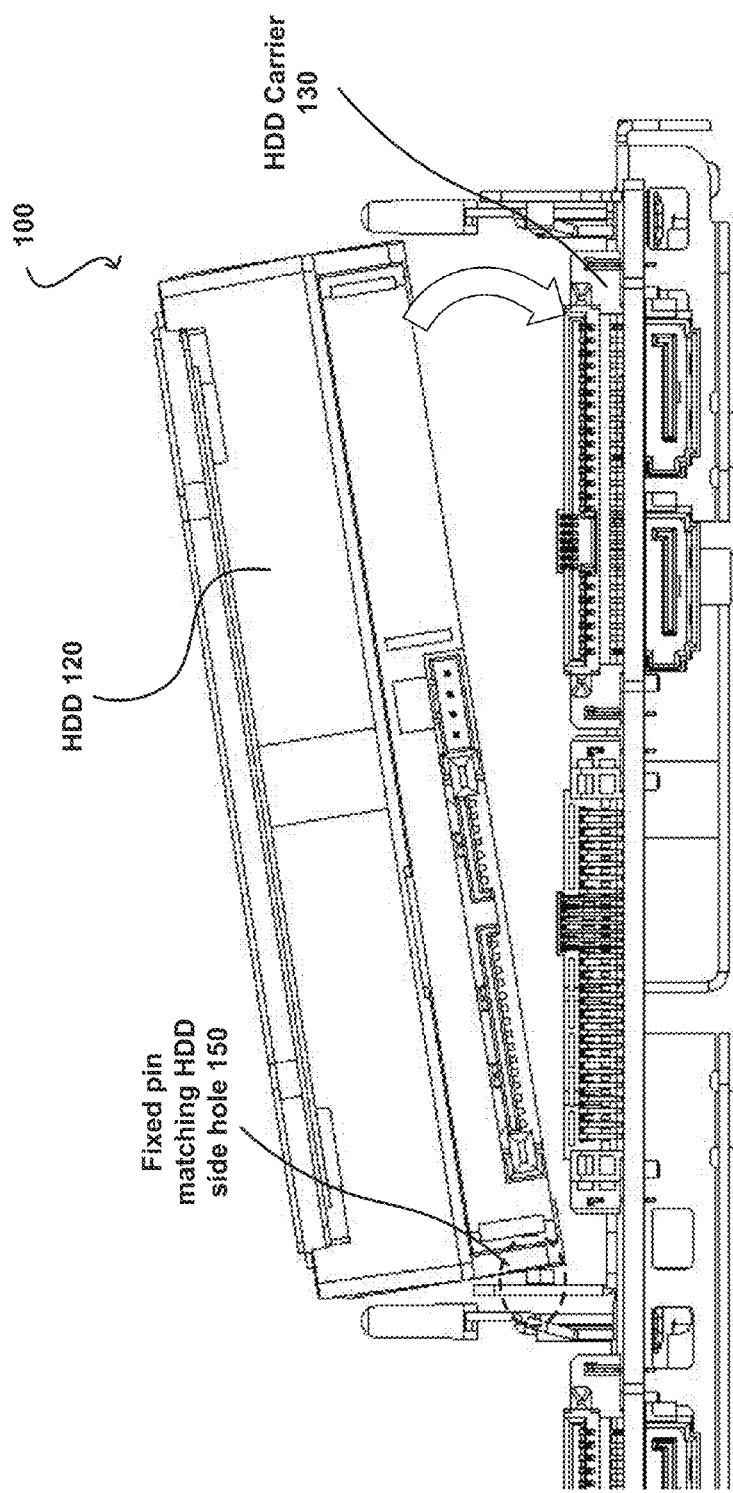

FIGS. 1B and 1C demonstrate schematic block diagrams of an exemplary HDD carrier 130 and an exemplary HDD base bracket 140 in accordance with implementations of the present technology. In this example, the HDD carrier 130 is placed on top of the HDD base bracket 140. The HDD carrier 130 has one or more fixed pins 150 while the HDD 120 has one or more corresponding holes on one side of the HDD 120. The HDD 120 can be quickly mounted onto the HDD carrier 130 by causing the one or more fixed pins 150 to be inserted into the one or more holes on the HDD 120. In some implementations, a user or a machine can tilt the HDD 120 with a small angle to match the one or more fixed pins 150 to the one or more corresponding holes on the HDD 120. After the one or more fixed pins 150 are inserted into the one or more corresponding holes on the HDD 120, the HDD 120 can be turned flat on the HDD carrier 130. In some embodiments, one or more fixed pins are located on the HDD 120 while one or more corresponding holes are located on the HDD carrier 130.

FIGS. 1D, 1E, 1F, 1G and 1H demonstrate schematic block diagrams of exemplary components of a HDD base bracket 140 of the server system 100 in accordance with implementations of the present technology. In this example, the HDD base bracket 140 includes one or more movable pins 170, one or more fixed pins 180, and a button latch 192.

Figure 1D:
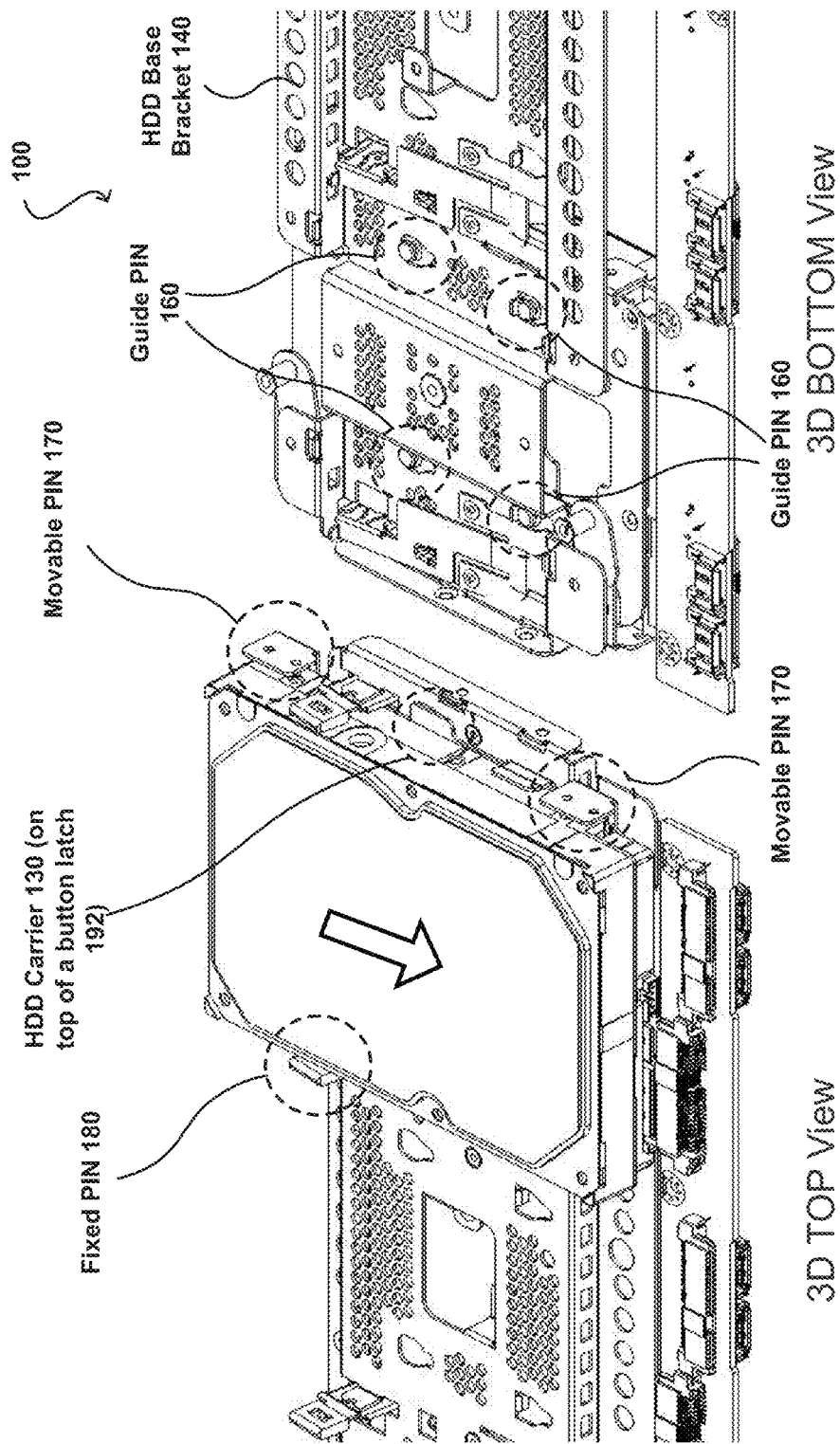
FIGS. 1D, 1E, 1F, 1G and 1H demonstrate schematic block diagrams of exemplary components of a HDD base bracket of a server system in accordance with implementations of the present technology.

As illustrated in FIG. 1D, in response to the HDD carrier 130 being slid from an open position to a close position, the one or more movable pins 170 can be caused to secure the HDD carrier 130 to the HDD base bracket 140. In response to the HDD carrier 130 being released from the close position on the HDD base bracket 140 or slid from a close position to an open position, the one or more movable pins 170 can be caused to unsecure the HDD carrier 130 from the HDD base bracket 140. In some implementations, in response to the HDD carrier 130 being slid into the close position, the button latch 192 can be activated to further secure the HDD carrier 130 into the HDD base bracket 140.

In this example, the HDD base bracket 140 further includes one or more guide pins 160 that are configured to facilitate aligning and/or mating of the HDD carrier 130 and the HDD base bracket 140. In some implementations, one or more guide pins can be installed on the HDD carrier 130.

Figure 1E:
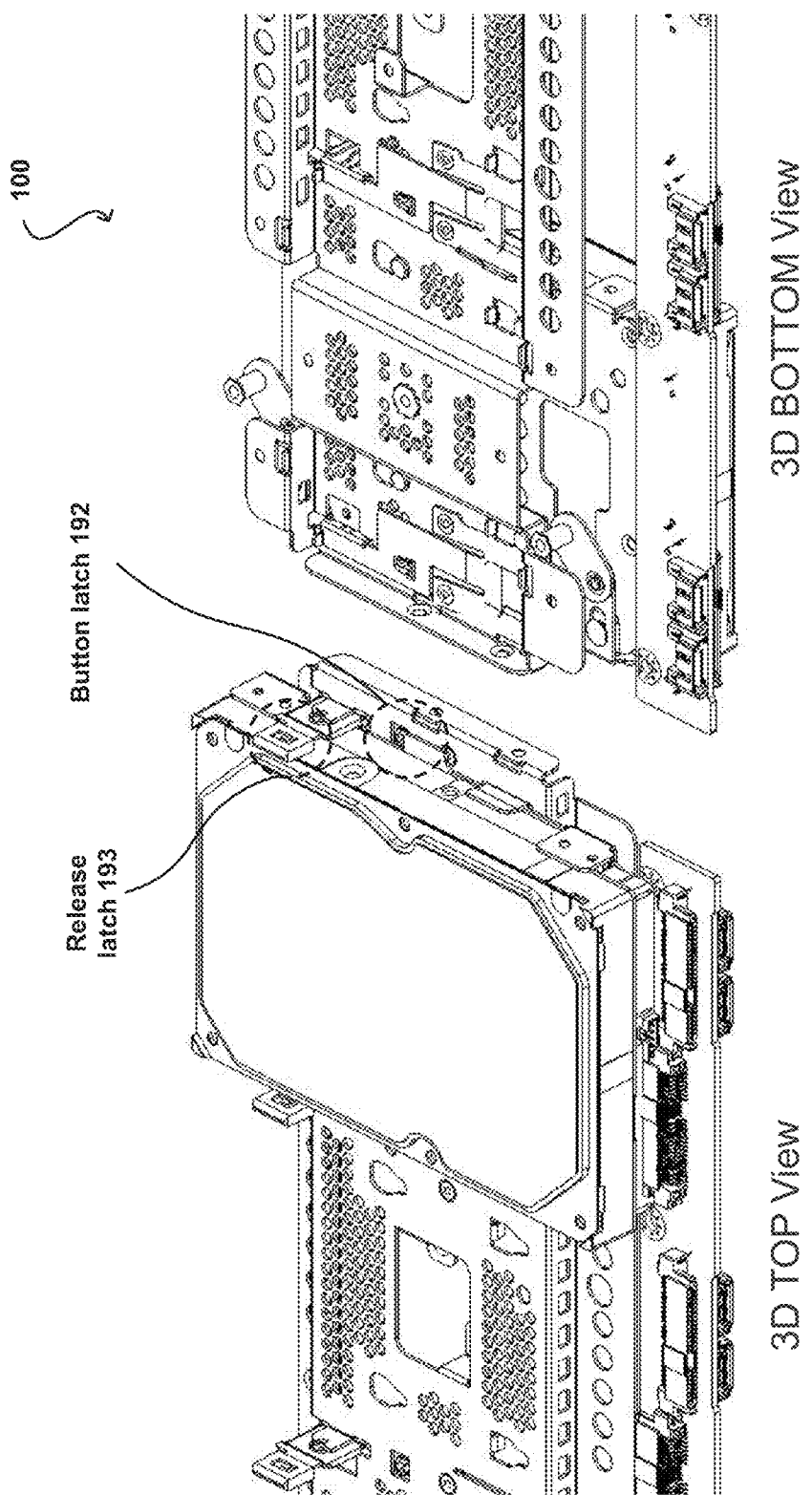
Figure 1F:
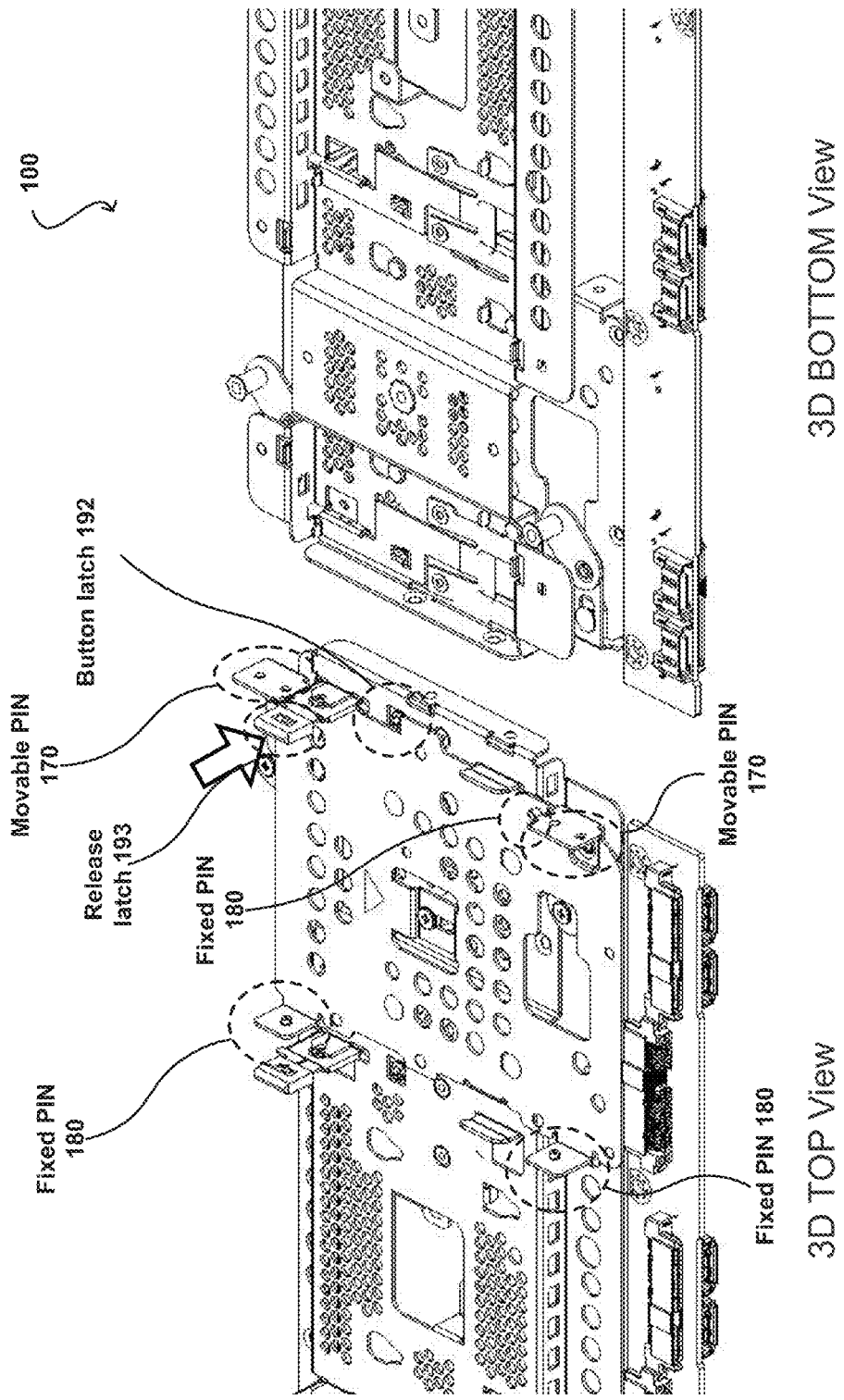

In some embodiments, when the HDD carrier 130 is in a non-close position inside the HDD base bracket 140, there is at least one portion of the HDD carrier 130 contacting and pressing press against the button latch 192 to disengage the button latch 192. In some implementations, the button latch 192 can be deactivated by pressing a release latch 193 of the HDD base bracket 140, as illustrated in FIGS. 1E and 1F. An action associated with pressing the release latch 193 can cause the button latch 192 to be deactivated. The HDD carrier 130 can then be slid out of a close position into an open position and further removed from the HDD base bracket 140.

Figure 1G:
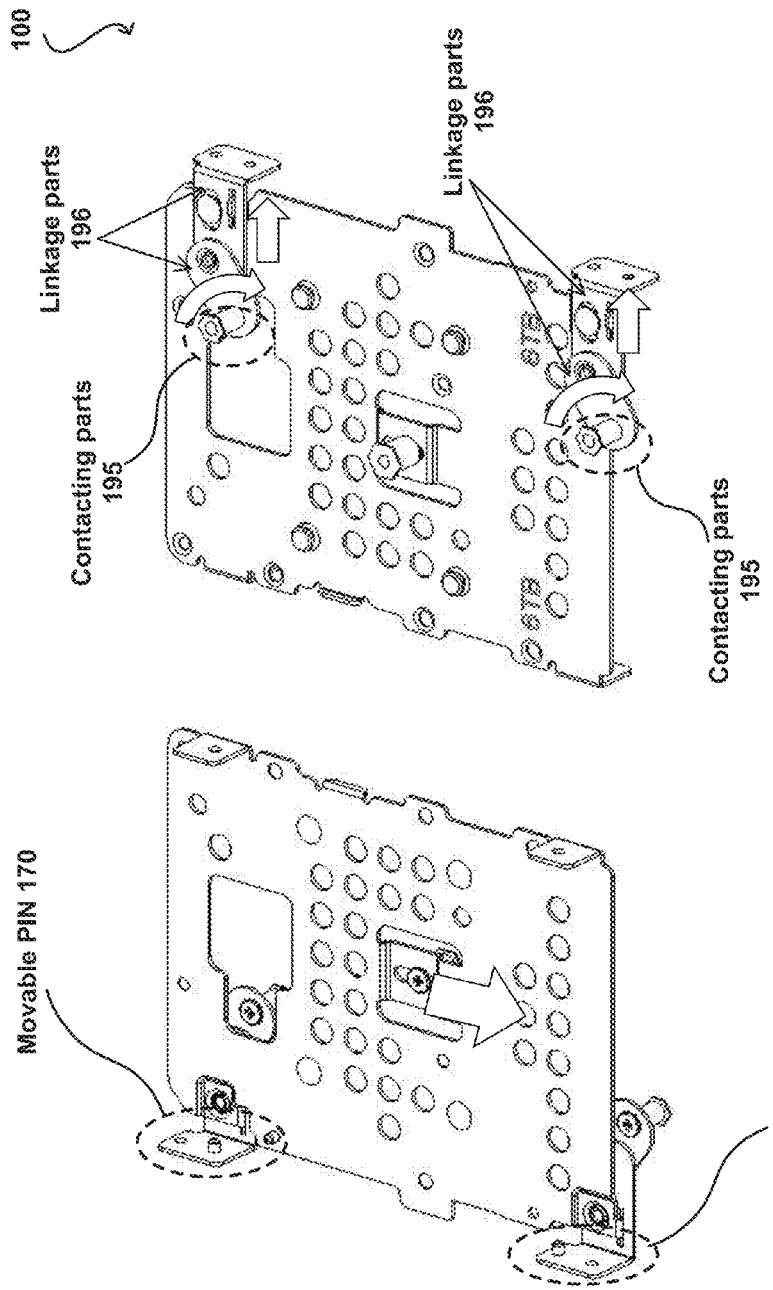

As illustrated in FIG. 1G, each of the one or more movable pins 170 includes one or more linkage parts 196 and at least one contacting part 195 touching at least one portion of the HDD carrier 130 when the HDD carrier 130 is placed on top of the HDD base bracket 140. A sliding motion of the HDD carrier 130 can cause the at least one contacting part 195 to move in the same direction of the HDD carrier 130 and further cause the one or more corresponding linkage parts 196 to either tighten the corresponding movable pin 170 against the HDD carrier 130 or detach the corresponding movable pin 170 from the HDD carrier 130 depending on directions of the sliding motion relative to the HDD base bracket 140.

Figure 1H:
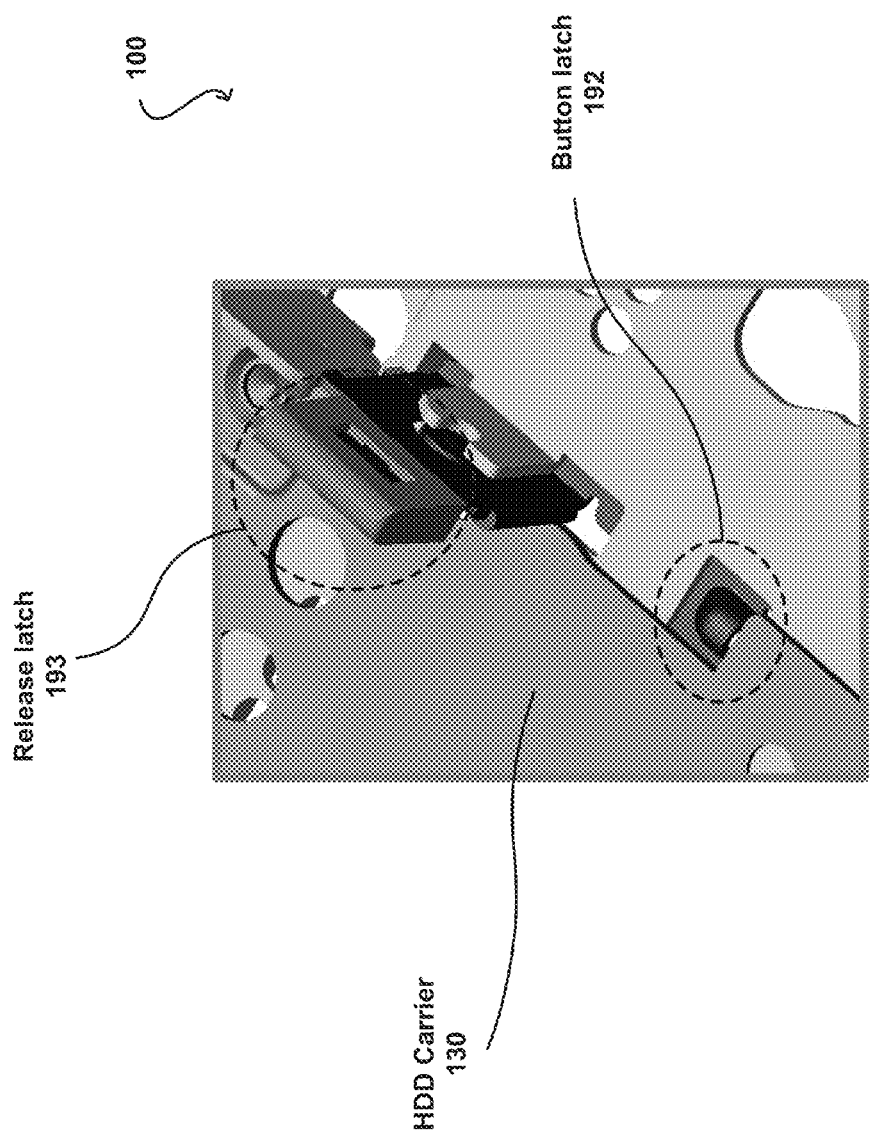

FIG. 1H illustrates a schematic block diagram of an exemplary button latch 192 and an exemplary release latch 193 in accordance with implementations of the present technology. In this example, a pressing action associated with the release latch 193 can cause at least one portion of the release latch 193 to contact at least one portion of the button latch 192 and cause the button latch 192 to be disengaged from the HDD carrier 130.

Although only certain components are shown within the server system 100 in FIGS. 1A-1H, various types of electronic or computing components that are capable of processing or storing data, or receiving or transmitting signals can also be included in the server system 100. Further, the electronic or computing components in the server system 100 can be configured to execute various types of application and/or can use various types of operating systems. These operating systems can include, but are not limited to, Android, Berkeley Software Distribution (BSD), iPhone OS (iOS), Linux, OS X, Unix-like Real-time Operating System (e.g., QNX), Microsoft Windows, Window Phone, and IBM z/OS.

Depending on the desired implementation for in the server system 100, a variety of networking and messaging protocols can be used, including but not limited to TCP/IP, open systems interconnection (OSI), file transfer protocol (FTP), universal plug and play (UpnP), network file system (NFS), common internet file system (CIFS), AppleTalk etc. As would be appreciated by those skilled in the art, the server system 100 illustrated in FIGS. 1A-1H are used for purposes of explanation. Therefore, a network system can be implemented with many variations, as appropriate, yet still provide a configuration of network platform in accordance with various embodiments of the present technology.

In exemplary configurations of FIGS. 1A-1H, the server system 100 can also include one or more wireless components operable to communicate with one or more electronic devices within a computing range of the particular wireless channel. The wireless channel can be any appropriate channel used to enable devices to communicate wirelessly, such as Bluetooth, cellular, NFC, or Wi-Fi channels. It should be understood that the device can have one or more conventional wired communications connections, as known in the art.

One of ordinary skilled in the art will appreciate that in the server system 100 in FIGS. 1A-1H are for illustration purpose only. The server system 100 may include fewer or various other components and/or combinations are possible as well within the scope of various embodiments.

The above discussion is meant to be illustrative of the principles and various embodiments of the present technology. Numerous variations and modifications will become apparent once the above disclosure is fully appreciated.

Figure 2:
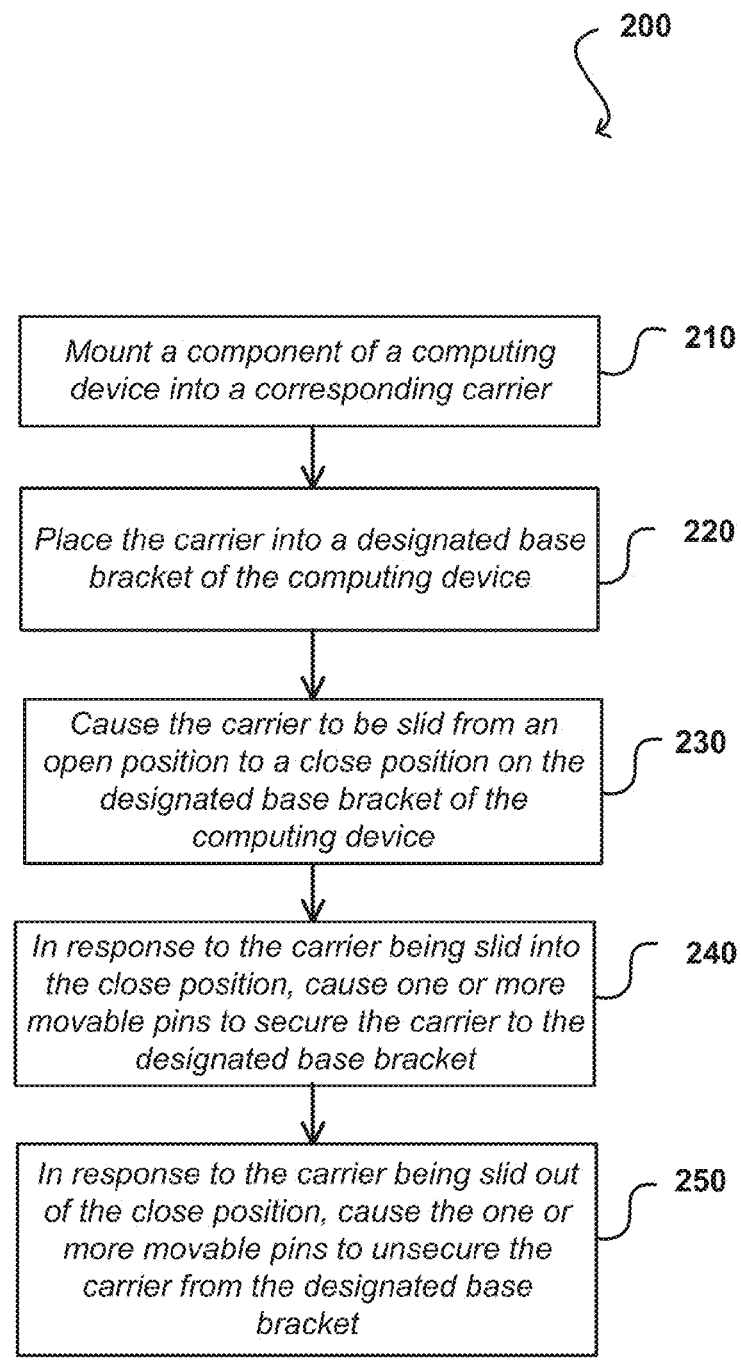
FIG. 2 illustrates an exemplary method of mounting and dismounting a computing component in accordance with implementations of the present technology.

FIG. 2 illustrates an exemplary method of mounting and dismounting a computing component in accordance with implementations of the present technology. It should be understood that the exemplary method 200 is presented solely for illustrative purposes and that in other methods in accordance with the present technology can include additional, fewer, or alternative steps performed in similar or alternative orders, or in parallel. The exemplary method 200 starts with mounting a component of a computing device into a corresponding carrier, at step 210. Various techniques can be used to attach a component to a carrier. For example, as illustrated in FIGS. 1B and 1C, at least one fixed pin and at least one corresponding hole are used to attach a HDD into a HDD carrier.

At step 220, the carrier can be either manually or automatically placed into a designated base bracket of the computing device. In some implementations, the designated base bracket is on a motherboard of the computing device, as illustrated in FIGS. 1A to 1G.

At step 230, the carrier can be slid from an open position to a close position on the designated base bracket. In response to the carrier being slid into the close position, one or more movable pins can be caused to secure the carrier to the designated base bracket, at step 240. In some embodiments, a close latch can be used to further secure a carrier to a corresponding base bracket. For example, when the carrier is slid into a close position, a button latch can be activated to further secure the carrier inside the corresponding base bracket, which are illustrated in FIGS. 1D, 1E, 1F and 1H.

At step 250, in response to the carrier being slid out of the close position, one or more movable pins can be caused to unsecure the carrier from the designated base bracket. In some embodiments, a close latch has to be deactivated before a carrier can be slid out of a close position on a corresponding base bracket. In some implementations, the close latch can be deactivated by an action associated with a release latch of the corresponding base bracket.

Terminologies

A computer network is a geographically distributed collection of nodes interconnected by communication links and segments for transporting data between endpoints, such as personal computers and workstations. Many types of networks are available, with the types ranging from local area networks (LANs) and wide area networks (WANs) to overlay and software-defined networks, such as virtual extensible local area networks (VXLANs).

LANs typically connect nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), or synchronous digital hierarchy (SDH) links. LANs and WANs can include layer 2 (L2) and/or layer 3 (L3) networks and devices.

The Internet is an example of a WAN that connects disparate networks throughout the world, providing global communication between nodes on various networks. The nodes typically communicate over the network by exchanging discrete frames or packets of data according to predefined protocols, such as the Transmission Control Protocol/Internet Protocol (TCP/IP). In this context, a protocol can refer to a set of rules defining how the nodes interact with each other. Computer networks can be further interconnected by an intermediate network node, such as a router, to extend the effective "size" of each network.

Overlay networks generally allow virtual networks to be created and layered over a physical network infrastructure. Overlay network protocols, such as Virtual Extensible LAN (VXLAN), Network Virtualization using Generic Routing Encapsulation (NVGRE), Network Virtualization Overlays (NVO3), and Stateless Transport Tunneling (STT), provide a traffic encapsulation scheme which allows network traffic to be carried across L2 and L3 networks over a logical tunnel. Such logical tunnels can be originated and terminated through virtual tunnel end points (VTEPs).

Moreover, overlay networks can include virtual segments, such as VXLAN segments in a VXLAN overlay network, which can include virtual L2 and/or L3 overlay networks over which VMs communicate. The virtual segments can be identified through a virtual network identifier (VNI), such as a VXLAN network identifier, which can specifically identify an associated virtual segment or domain.

Network virtualization allows hardware and software resources to be combined in a virtual network. For example, network virtualization can allow multiple numbers of VMs to be attached to the physical network via respective virtual LANs (VLANs). The VMs can be grouped according to their respective VLAN, and can communicate with other VMs as well as other devices on the internal or external network.

Network segments, such as physical or virtual segments, networks, devices, ports, physical or logical links, and/or traffic in general can be grouped into a bridge or flood domain. A bridge domain or flood domain can represent a broadcast domain, such as an L2 broadcast domain. A bridge domain or flood domain can include a single subnet, but can also include multiple subnets. Moreover, a bridge domain can be associated with a bridge domain interface on a network device, such as a switch. A bridge domain interface can be a logical interface which supports traffic between an L2 bridged network and an L3 routed network. In addition, a bridge domain interface can support internet protocol (IP) termination, VPN termination, address resolution handling, MAC addressing, etc. Both bridge domains and bridge domain interfaces can be identified by a same index or identifier.

Furthermore, endpoint groups (EPGs) can be used in a network for mapping applications to the network. In particular, EPGs can use a grouping of application endpoints in a network to apply connectivity and policy to the group of applications. EPGs can act as a container for buckets or collections of applications, or application components, and tiers for implementing forwarding and policy logic. EPGs also allow separation of network policy, security, and forwarding from addressing by instead using logical application boundaries.

Cloud computing can also be provided in one or more networks to provide computing services using shared resources. Cloud computing can generally include Internet-based computing in which computing resources are dynamically provisioned and allocated to client or user computers or other devices on-demand, from a collection of resources available via the network (e.g., "the cloud"). Cloud computing resources, for example, can include any type of resource, such as computing, storage, and network devices, virtual machines (VMs), etc. For instance, resources can include service devices (firewalls, deep packet inspectors, traffic monitors, load balancers, etc.), compute/processing devices (servers, CPU's, memory, brute force processing capability), storage devices (e.g., network attached storages, storage area network devices), etc. In addition, such resources can be used to support virtual networks, virtual machines (VM), databases, applications (Apps), etc.

Cloud computing resources can include a "private cloud," a "public cloud," and/or a "hybrid cloud." A "hybrid cloud" can be a cloud infrastructure composed of two or more clouds that inter-operate or federate through technology. In essence, a hybrid cloud is an interaction between private and public clouds where a private cloud joins a public cloud and utilizes public cloud resources in a secure and scalable manner. Cloud computing resources can also be provisioned via virtual networks in an overlay network, such as a VXLAN.

Figure 3:
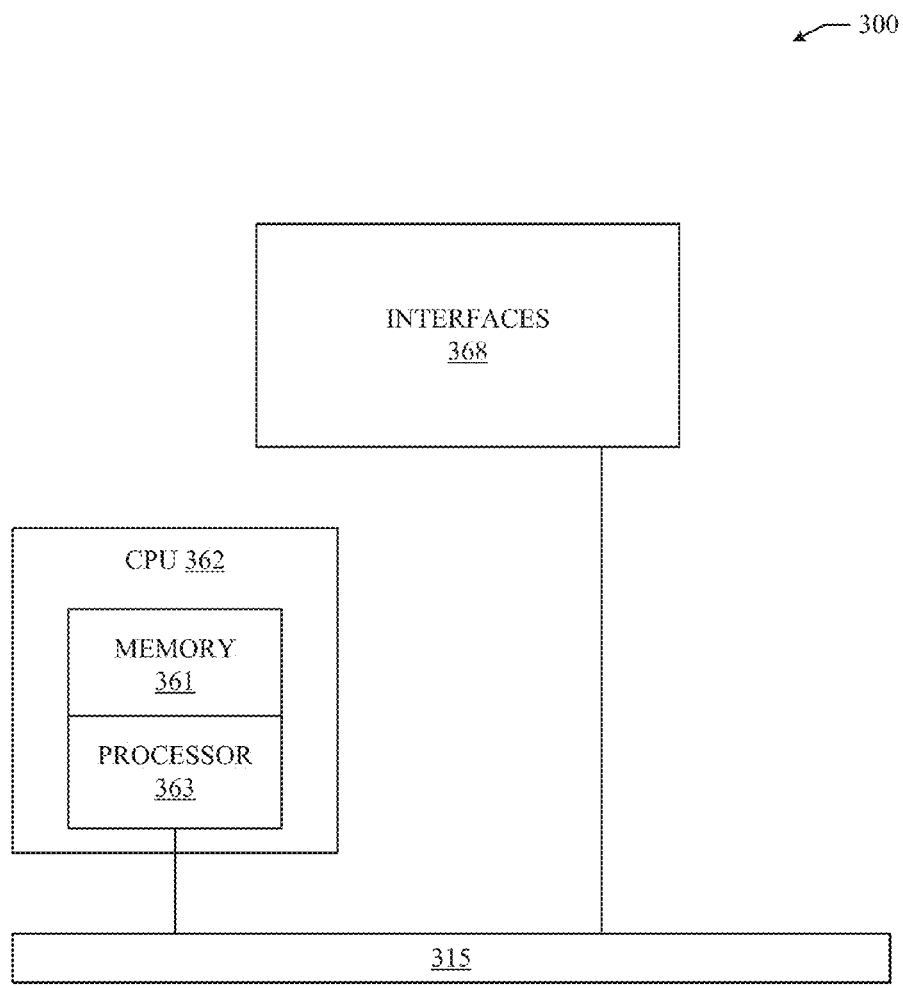
FIG. 3 illustrates an exemplary computing device in accordance with various implementations of the technology.

In a network switch system, a lookup database can be maintained to keep track of routes between a number of end points attached to the switch system. However, end points can have various configurations and are associated with numerous tenants. These end-points can have various types of identifiers, e.g., IPv4, IPv6, or Layer-2. The lookup database has to be configured in different modes to handle different types of end-point identifiers. Some capacity of the lookup database is carved out to deal with different address types of incoming packets. Further, the lookup database on the network switch system is typically limited by 1K virtual routing and forwarding (VRFs). Therefore, an improved lookup algorithm is desired to handle various types of end-point identifiers. The disclosed technology addresses the need in the art for address lookups in a telecommunications network. Disclosed are systems, methods, and computer-readable storage media for unifying various types of end-point identifiers by mapping end-point identifiers to a uniform space and allowing different forms of lookups to be uniformly handled. A brief introductory description of example systems and networks, as illustrated in FIGS. 3 and 4, is disclosed herein. These variations shall be described herein as the various examples are set forth. The technology now turns to FIG. 3.

FIG. 3 illustrates an example computing device 300 suitable for implementing the present technology. Computing device 300 includes a master central processing unit (CPU) 362, interfaces 368, and a bus 315 (e.g., a PCI bus). When acting under the control of appropriate software or firmware, the CPU 362 is responsible for executing packet management, error detection, and/or routing functions, such as miscabling detection functions, for example. The CPU 362 preferably accomplishes all these functions under the control of software including an operating system and any appropriate applications software. CPU 362 can include one or more processors 363 such as a processor from the Motorola family of microprocessors or the MIPS family of microprocessors. In an alternative embodiment, processor 363 is specially designed hardware for controlling the operations of the computing device 300. In a specific embodiment, a memory 361 (such as non-volatile RAM and/or ROM) also forms part of CPU 362. However, there are many different ways in which memory could be coupled to the system.

The interfaces 368 are typically provided as interface cards (sometimes referred to as "line cards"). Generally, they control the sending and receiving of data packets over the network and sometimes support other peripherals used with the computing device 300. Among the interfaces that can be provided are Ethernet interfaces, frame relay interfaces, cable interfaces, DSL interfaces, token ring interfaces, and the like. In addition, various very high-speed interfaces can be provided such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces can include ports appropriate for communication with the appropriate media. In some cases, they can also include an independent processor and, in some instances, volatile RAM. The independent processors can control such communications intensive tasks as packet switching, media control and management. By providing separate processors for the communications intensive tasks, these interfaces allow the master microprocessor 362 to efficiently perform routing computations, network diagnostics, security functions, etc.

Although the system shown in FIG. 3 is one specific computing device of the present technology, it is by no means the only network device architecture on which the present invention can be implemented. For example, an architecture having a single processor that handles communications as well as routing computations, etc. is often used. Further, other types of interfaces and media could also be used with the router.

Regardless of the network device's configuration, it can employ one or more memories or memory modules (including memory 361) configured to store program instructions for the general-purpose network operations and mechanisms for roaming, route optimization and routing functions described herein. The program instructions can control the operation of an operating system and/or one or more applications, for example. The memory or memories can also be configured to store tables such as mobility binding, registration, and association tables, etc.

Figure 4A:
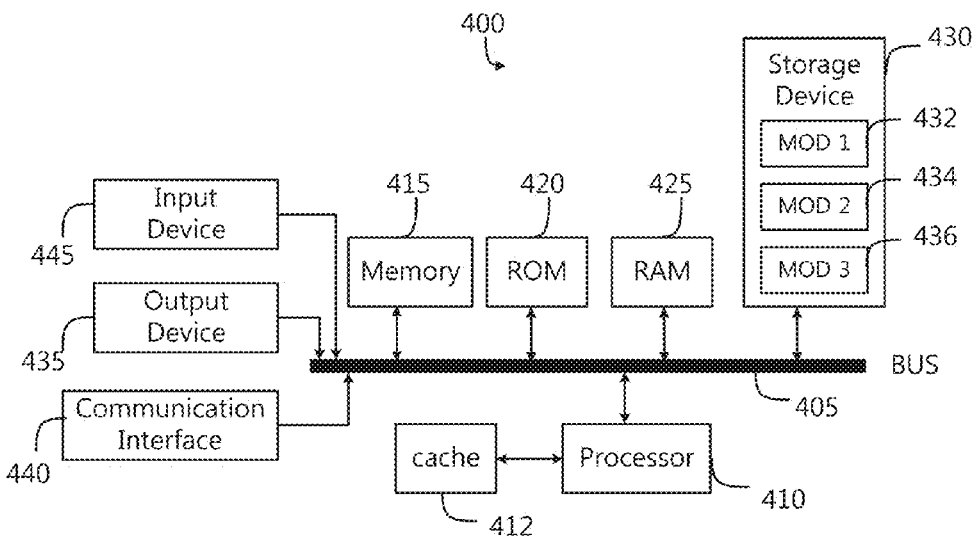
FIGS. 4A and 4B illustrate exemplary systems in accordance with various embodiments of the present technology.
Figure 4B:
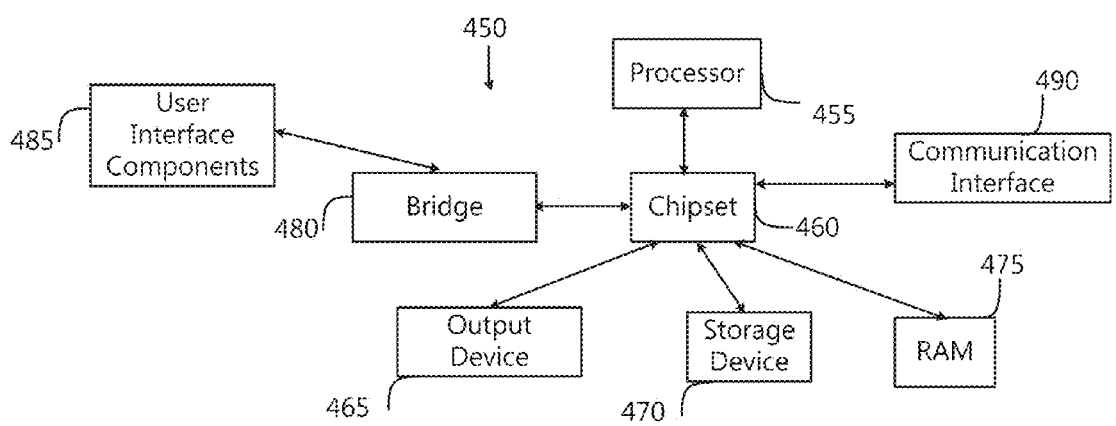

FIG. 4A, and FIG. 4B illustrate example possible systems in accordance with various aspects of the present technology. The more appropriate embodiment will be apparent to those of ordinary skill in the art when practicing the present technology. Persons of ordinary skill in the art will also readily appreciate that other system examples are possible.

FIG. 4A illustrates a conventional system bus computing system architecture 400 wherein the components of the system are in electrical communication with each other using a bus 405. Example system 400 includes a processing unit (CPU or processor) 410 and a system bus 405 that couples various system components including the system memory 415, such as read only memory (ROM) 420 and random access memory (RAM) 425, to the processor 410. The system 400 can include a cache of high-speed memory connected directly with, in close proximity to, or integrated as part of the processor 410. The system 400 can copy data from the memory 415 and/or the storage device 430 to the cache 412 for quick access by the processor 410. In this way, the cache can provide a performance boost that avoids processor 410 delays while waiting for data. These and other modules can control or be configured to control the processor 410 to perform various actions. Other system memory 415 can be available for use as well. The memory 415 can include multiple different types of memory with different performance characteristics. The processor 410 can include any general purpose processor and a hardware module or software module, such as module 432, module 434, and module 436 stored in storage device 430, configured to control the processor 410 as well as a special-purpose processor where software instructions are incorporated into the actual processor design. The processor 410 can essentially be a completely self-contained computing system, containing multiple cores or processors, a bus, memory controller, cache, etc. A multi-core processor can be symmetric or asymmetric.

To enable user interaction with the computing device 400, an input device 445 can represent any number of input mechanisms, such as a microphone for speech, a touch-sensitive screen for gesture or graphical input, keyboard, mouse, motion input, speech and so forth. An output device 435 can also be one or more of a number of output mechanisms known to those of skill in the art. In some instances, multimodal systems can enable a user to provide multiple types of input to communicate with the computing device 400. The communications interface 440 can generally govern and manage the user input and system output. There is no restriction on operating on any particular hardware arrangement and therefore the basic features here can easily be substituted for improved hardware or firmware arrangements as they are developed.

Storage device 430 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 425, read only memory (ROM) 420, and hybrids thereof.

The storage device 430 can include software modules 432, 434, 436 for controlling the processor 410. Other hardware or software modules are contemplated. The storage device 430 can be connected to the system bus 405. In one aspect, a hardware module that performs a particular function can include the software component stored in a computer-readable medium in connection with the necessary hardware components, such as the processor 410, bus 405, output device 435 (e.g., a display), and so forth, to carry out the function.

FIG. 4B illustrates a computer system 450 having a chipset architecture that can be used in executing the described method and generating and displaying a graphical user interface (GUI). Computer system 450 is an example of computer hardware, software, and firmware that can be used to implement the disclosed technology. System 450 can include a processor 455, representative of any number of physically and/or logically distinct resources capable of executing software, firmware, and hardware configured to perform identified computations. Processor 455 can communicate with a chipset 460 that can control input to and output from processor 455. In this example, chipset 460 outputs information to output 465, such as a display, and can read and write information to storage device 470, which can include magnetic media, and solid state media, for example. Chipset 460 can also read data from and write data to RAM 475. A bridge 480 for interfacing with a variety of user interface components 485 can be provided for interfacing with chipset 460. Such user interface components 485 can include a keyboard, a microphone, touch detection and processing circuitry, a pointing device, such as a mouse, and so on. In general, inputs to system 450 can come from any of a variety of sources, machine generated and/or human generated.

Chipset 460 can also interface with one or more communication interfaces 590 that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by processor 455 analyzing data stored in storage 470 or RAM 475. Further, the machine can receive inputs from a user via user interface components 485 and execute appropriate functions, such as browsing functions by interpreting these inputs using processor 455.

It can be appreciated that example systems 400 and 450 can have more than one processor 410 or be part of a group or cluster of computing devices networked together to provide greater processing capability.

For clarity of explanation, in some instances the present technology can be presented as including individual functional blocks including functional blocks comprising devices, device components, steps or routines in a method embodied in software, or combinations of hardware and software.

In some examples, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions can be, for example, binaries, intermediate format instructions such as assembly language, firmware, or source code. Examples of computer-readable media that can be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Various aspects of the present technology provide systems and methods for mounting and dismounting a component of a computing device. While specific examples have been cited above showing how the optional operation can be employed in different instructions, other examples can incorporate the optional operation into different instructions. For clarity of explanation, in some instances the present technology can be presented as including individual functional blocks including functional blocks comprising devices, device components, steps or routines in a method embodied in software, or combinations of hardware and software.

The various examples can be further implemented in a wide variety of operating environments, which in some cases can include one or more server computers, user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

To the extent examples, or portions thereof, are implemented in hardware, the present invention can be implemented with any or a combination of the following technologies: a discrete logic circuit(s) having logic gates for implementing logic functions upon data signals, an application specific integrated circuit (ASIC) having appropriate combinational logic gates, programmable hardware such as a programmable gate array(s) (PGA), a field programmable gate array (FPGA), etc.

Most examples utilize at least one network that would be familiar to those skilled in the art for supporting communications using any of a variety of commercially-available protocols, such as TCP/IP, OSI, FTP, UPnP, NFS, CIFS, AppleTalk etc. The network can be, for example, a local area network, a wide-area network, a virtual private network, the Internet, an intranet, an extranet, a public switched telephone network, an infrared network, a wireless network and any combination thereof.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions can be, for example, binaries, intermediate format instructions such as assembly language, firmware, or source code. Examples of computer-readable media that can be used to store instructions, information used, and/or information created during methods according to described examples include magnetic or optical disks, flash memory, USB devices provided with non-volatile memory, networked storage devices, and so on.

Devices implementing methods according to these technology can comprise hardware, firmware and/or software, and can take any of a variety of form factors. Typical examples of such form factors include server computers, laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

In examples utilizing a Web server, the Web server can run any of a variety of server or mid-tier applications, including HTTP servers, FTP servers, CGI servers, data servers, Java servers and business application servers. The server(s) can also be capable of executing programs or scripts in response requests from user devices, such as by executing one or more Web applications that can be implemented as one or more scripts or programs written in any programming language, such as Java®, C, C# or C++ or any scripting language, such as Pert, Python or TCL, as well as combinations thereof. The server(s) can also include database servers, including without limitation those commercially available from open market.

The server farm can include a variety of data stores and other memory and storage media as discussed above. These can reside in a variety of locations, such as on a storage medium local to (and/or resident in) one or more of the computers or remote from any or all of the computers across the network. In a particular set of examples, the information can reside in a storage-area network (SAN) familiar to those skilled in the art. Similarly, any necessary files for performing the functions attributed to the computers, servers or other network devices can be stored locally and/or remotely, as appropriate. Where a system includes computerized devices, each such device can include hardware elements that can be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system can also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared computing device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate examples can have numerous variations from that described above. For example, customized hardware might also be used and/or particular elements might be implemented in hardware, software (including portable software, such as applets) or both. Further, connection to other computing devices such as network input/output devices can be employed.

Storage media and computer readable media for containing code, or portions of code, can include any appropriate media known or used in the art, including storage media and computing media, such as but not limited to volatile and non-volatile, removable and non-removable media implemented in any method or technology for storage and/or transmission of information such as computer readable instructions, data structures, program modules or other data, including RAM, ROM, EPROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the technology and teachings provided herein, a person of ordinary skill in the art will appreciate other ways and/or methods to implement the various aspects of the present technology.

The specification and drawings are, accordingly, to be regarded in an illustrative rather than a restrictive sense. It will, however, be evident that various modifications and changes can be made thereunto without departing from the broader spirit and scope of the invention as set forth in the claims.

What is claimed is:

1. A system, comprising:
   at least one component configured to be mounted and dismounted from the system;
   at least one carrier configured to be attached and detached from the at least one component; and
   at least one designated base bracket located on a motherboard of the system;
   wherein the at least one designated base bracket is configured to secure the at least one component to the motherboard or unsecure the at least one component from the motherboard,
   wherein each of the at least one designated base bracket includes one or more movable pins and one or more fixed pins, the one or more movable pins and the one or more fixed pins being disposed on different sides of the at least one designated base bracket,
   wherein the one or more movable pins are configured to directly secure a corresponding carrier to a corresponding designated base bracket in response to the carrier being slid from an open position to a close position on the corresponding designated base bracket,
   wherein the corresponding designated base bracket further includes a close latch, the close latch configured to further secure the carrier inside the corresponding designated base bracket in response to the carrier being slid into the close position.

2. The system of claim 1, wherein the one or more movable pins are further configured to unsecure the carrier from the corresponding designated base bracket in response to the carrier being released from the close position.

3. The system of claim 1, wherein the close latch is a button latch, the button latch configured to be activated when the carrier is slid into the close position.

4. The system of claim 1 wherein the close latch is deactivated by an action associated with a release latch of the corresponding designated base bracket.

5. The system of claim 1, wherein at least one portion of the carrier is enabled to disengage the close latch when the carrier is in a non-close position on the corresponding designated base bracket.

6. The system of claim 1, wherein each of the one or more movable pins include one or more linkage parts and one or more contacting parts, the one or more contacting parts configured to touch at least one portion of the carrier when the carrier is placed on top of the corresponding designated base bracket.

7. The system of claim 6, wherein the one or more contacting parts are further configured to move in the same direction of the carrier and further cause the one or more linkage parts to either tighten a corresponding movable pin against the corresponding carrier or detach the corresponding movable pin from the corresponding carrier.

8. A motherboard, comprising:
at least one designated base bracket, each of the at least one designated base bracket including one or more movable pins and one or more fixed pins, the one or more movable pins and the one or more fixed pins being disposed on different sides of the at least one designated base bracket;
wherein each of the at least one designated base bracket is configured to secure a corresponding component of the motherboard to the motherboard or unsecure the corresponding component from the motherboard, the corresponding component being attached to a carrier,
wherein the one or more movable pins are configured to directly secure the carrier to a corresponding designated base bracket in response to the carrier being slid from an open position to a close position on the corresponding designated base bracket,
wherein the corresponding designated base bracket further includes a close latch, the close latch configured to further secure the carrier inside the corresponding designated base bracket in response to the carrier being slid into the close position.

9. The motherboard of claim 8, wherein the close latch is a button latch, the button latch configured to be activated when the carrier is slid into the close position.

10. The motherboard of claim 8, wherein the close latch is deactivated by an action associated with a release latch of the corresponding designated base bracket.

11. The motherboard of claim 8, wherein at least one portion of the carrier is enabled to disengage the close latch when the carrier is in a non-close position on the corresponding designated base bracket.

12. The motherboard of claim 8, wherein each of the one or more movable pins include one or more linkage parts and one or more contacting parts, the one or more contacting parts configured to touch at least one portion of the carrier when the carrier is placed on top of the corresponding designated base bracket.

13. A system, comprising:
at least one component configured to be mounted and dismounted from the system;
at least one carrier configured to be attached and detached from the at least one component; and
at least one designated base bracket located on a motherboard of the system;
wherein the at least one designated base bracket is configured to secure the at least one component to the motherboard or unsecure the at least one component from the motherboard,
wherein each of the at least one designated base bracket includes one or more movable pins and one or more fixed pins, the one or more movable pins and the one or more fixed pins being disposed on different sides of the at least one designated base bracket,
wherein the one or more movable pins are configured to directly secure a corresponding carrier to a corresponding designated base bracket in response to the carrier being slid from an open position to a close position on the corresponding designated base bracket,
wherein each of the one or more movable pins include one or more linkage parts and one or more contacting parts, the one or more contacting parts configured to touch at least one portion of the carrier when the carrier is placed on top of the corresponding designated base bracket.

14. The system of claim 13, wherein the one or more movable pins are further configured to unsecure the carrier from the corresponding designated base bracket in response to the carrier being released from the close position.

15. The system of claim 13, wherein the corresponding designated base bracket further includes a close latch, the close latch configured to further secure the carrier inside the corresponding designated base bracket in response to the carrier being slid into the close position.

16. The system of claim 15, wherein the close latch is a button latch, the button latch configured to be activated when the carrier is slid into the close position.

17. The system of claim 15, wherein the close latch is deactivated by an action associated with a release latch of the corresponding designated base bracket.

18. The system of claim 15, wherein at least one portion of the carrier is enabled to disengage the close latch when the carrier is in a non-close position on the corresponding designated base bracket.

19. The system of claim 13, wherein the one or more contacting parts are further configured to move in the same direction of the carrier and further cause the one or more linkage parts to either tighten a corresponding movable pin against the corresponding carrier or detach the corresponding movable pin from the corresponding carrier.

* * * * *